(12) United States Patent
An et al.

(10) Patent No.: US 6,445,016 B1
(45) Date of Patent: Sep. 3, 2002

(54) SILICON-ON-INSULATOR (SOI) TRANSISTOR HAVING PARTIAL HETERO SOURCE/DRAIN JUNCTIONS FABRICATED WITH HIGH ENERGY GERMANIUM IMPLANTATION

(75) Inventors: Judy Xilin An, San Jose; Bin Yu, Cupertino, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/795,159

(22) Filed: Feb. 28, 2001

(51) Int. Cl.$^7$ ................ H01L 31/072; H01L 31/109; H01L 31/0328; H01L 31/0336
(52) U.S. Cl. ............ 257/192; 257/289; 257/347
(58) Field of Search ................ 257/192, 289, 257/347

(56) References Cited

U.S. PATENT DOCUMENTS

| | | | |
|---|---|---|---|
| 5,686,735 A | | 11/1997 | Sim |
| 5,863,831 A | * | 1/1999 | Ling et al. ............ 438/515 |
| 6,008,099 A | | 12/1999 | Sultan et al. |
| 6,096,628 A | | 8/2000 | Greenlaw et al. |
| 6,339,013 B1 | * | 1/2002 | Naseem et al. .......... 438/491 |

* cited by examiner

Primary Examiner—Ngân V. Ngô
(74) Attorney, Agent, or Firm—Renner, Otto, Boisselle & Sklar, LLP (57) ABSTRACT

A silicon-on-insulator (SOI) transistor. The SOI transistor having a source and a drain having a body disposed therebetween, the source being implanted with germanium to form an area of silicon-germanium adjacent a source/body junction in a lower portion of the source, the area of silicon-germanium in the source forming a hetero junction along a lower portion of the source/body junction.

9 Claims, 5 Drawing Sheets

FIG. 7f ical Field

The present invention relates generally to silicon-on-insulator (SOI) devices and methods of forming the same and, more particularly, to SOI devices and methods for forming which avoid or reduce floating body effects.

BACKGROUND ART

Silicon-on-insulator (SOI) materials offer potential advantages over bulk materials for the fabrication of high performance integrated circuits. Dielectric isolation and reduction of parasitic capacitance improve circuit performance, and virtually eliminate latch-up in CMOS circuits. In addition, circuit layout in SOI can be greatly simplified and packing density greatly increased if the devices are made without body contacts (i.e., if the body regions of these devices are "floating"). However, partially-depleted metal oxide semiconductor field effect transistors (MOSFETs) on SOI materials typically exhibit parasitic effects due to the presence of the floating body ("floating body effects"). These floating body effects may result in undesirable performance in SOI devices.

It will be appreciated from the foregoing that a need exists for SOI MOSFETs having reduced floating body effects.

SUMMARY OF THE INVENTION

According to one aspect of the invention, the invention is a silicon-on-insulator (SOI) transistor. The SOI transistor having a source and a drain having a body disposed therebetween, the source being implanted with germanium to form an area of silicon-germanium adjacent a source/body junction in a lower portion of the source, the area of silicon-germanium in the source forming a hetero junction along a lower portion of the source/body junction.

According to another aspect of the invention, the invention is a method of fabricating a silicon-on-insulator (SOI) transistor. The method including the steps of providing an active layer disposed on a buried oxide (BOX) layer, the BOX layer being disposed on a substrate, the active layer having an active region defined by isolation regions; forming a transistor in the active region, the transistor having a source and a drain having a body disposed therebetween, and a gate disposed on the body; and implanting the source with germanium to form an area of silicongermanium adjacent a source/body junction in a lower portion of the source, the area of silicon-germanium in the source forming a hetero junction along a lower portion of the source/body junction.

BRIEF DESCRIPTION OF DRAWINGS

These and further features of the present invention will be apparent with reference to the following description and drawings, wherein.

DISCLOSURE OF INVENTION

In the detailed description which follows, identical components have been given the same reference numerals, regardless of whether they are shown in different embodiments of the present invention. To illustrate the present invention in a clear and concise manner, the drawings may not necessarily be to scale and certain features may be shown in somewhat schematic form.

Figure 1:
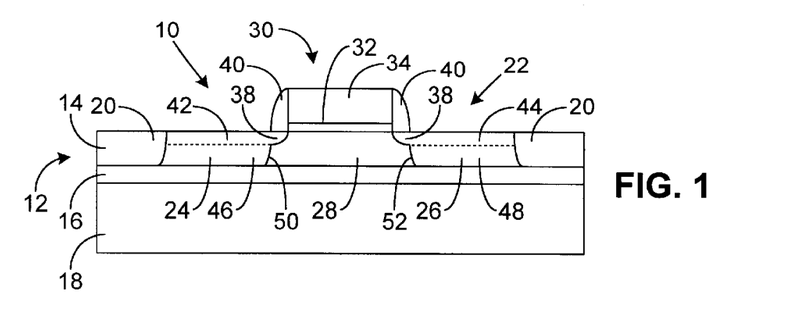
FIG. 1 is a cross-section of a silicon-on-insulator (SOI) device according to a first embodiment of the present invention.

Referring to FIG. 1, a silicon-on-insulator (SOI) device 10, also referred herein as a transistor or a MOSFET, is fabricated on an SOI wafer 12 which has a silicon active layer 14 disposed on a buried oxide (BOX) layer 16. The BOX layer 16 is disposed on a silicon substrate 18. Within the active layer 14 shallow trench isolation (STI) regions 20 define the placement of active regions 22 used for the fabrication of active devices, such as the device 10 described more fully below.

The device 10 has a source 24 and a drain 26 with a body 28, or channel, disposed therebetween. Disposed on top of the body 28 is a gate 30. The gate 30 includes a layer of gate oxide 32 and a polysilicon gate portion 34, or other gate stack formation, as is known in the art. After the gate 30 has been formed, the source 24 and drain 26 are doped to form extensions 38 as are known in the art. Following extension 38 formation, side wall spacers 40 are deposited adjacent to gate 30 and the source 24 and the drain 26 are doped with deep implantations. By way of example, the source 24 and the drain 26 receive N+ doping and the body 28 is initially P doped. Alternatively, the source 24 and the drain 26 may receive P+ doping and the body 28 is N doped. In another alternative, the body 28 is undoped. In yet another alternative, the source 24 and the drain 26 are each N doped or P doped.

Figure 1A:
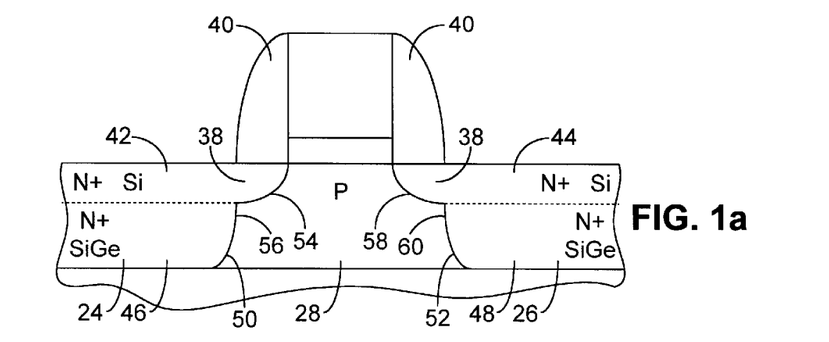
FIG. 1a is an enlarged partial cross-section view of the SOI device of FIG. 1.

With additional reference to FIG. 1a, the device 10 is implanted with germanium (Ge). The germanium is planted at a zero degree angle with respect to vertical (i.e., in a straight downward direction) and at a relatively high energy such that most of the germanium traverses an upper portion 42 of the source 24 and an upper portion 44 of the drain 26. In one example, the implantation energy of the germanium is about 20 kev to about 80 kev. The germanium is implanted with a dosage of about $1 \times 10^{14}$ atoms/cm$^2$ to about $1 \times 10^{16}$ atoms/cm$^2$. The germanium collects in a lower portion 46 of the source 24 and the lower portion 48 of the drain 26. In each of the lower portions 46 and 48, the active layer 14 becomes silicone germanium (SiGe). In one embodiment, the atomic concentration of silicon in the lower portions 46 and 48 is about 30% to about 70% and the atomic concentration of germanium is about 70% to about 30%.

Due to the germanium implantation, a junction 50 between the source 24 and the body 28 forms a SiGe/Si junction along a lower portion 56 of the source/body junction 50 where silicon-germanium is present in the source 24 and silicon is present in the body 28. More specifically, the silicon-germanium of the lower portion 46 of the source 24 has a narrow band gap and forms a hetero junction with the body 28 along the lower portion 56 of the source/drain body junction 50. To elaborate, germanium is implanted such that the lower portion 46 of the source 24 is generally co-extensive with the deep implantation of the source 24 and very little germanium is present in the upper portion 42 of the source 24 such that the extension 38 is relatively germanium free and an upper portion 54 of the source/body junction 50 forms a Si/Si junction.

As one skilled in the art will appreciate, a drain/body junction 52 will also be divided into an upper portion 58 where the extension 38 of the drain 26 contacts the body 28 and a lower portion 60 where the deep implant, or lower portion 48, of the drain 26 contacts the body 28. Since the lower portion 48 of the drain 26 is also implanted with germanium, the lower portion 60 of the drain/body junction 52 will also form a hetero junction, similar to the lower portion 56 of the source/body junction 50.

The partial hetero junctions present along the source/body junction 50 and the drain/body junction 52 serve to suppress floating body effects (FBE). More specifically, holes will be transported from the body 28 respectively to the source 24 or the drain 26 thereby reducing floating body effects by removing charge from the body 28. The hetero junctions of the lower portions 56, 60 of the source/body junction 50 and the drain/body junction 52, however, form a large barrier for electron flow. To maintain performance of the device 10, the upper portions 42, 44 of the source 24 and the drain 26 remain relatively germanium free so that barriers to electron flow are minimized.

Figure 2:
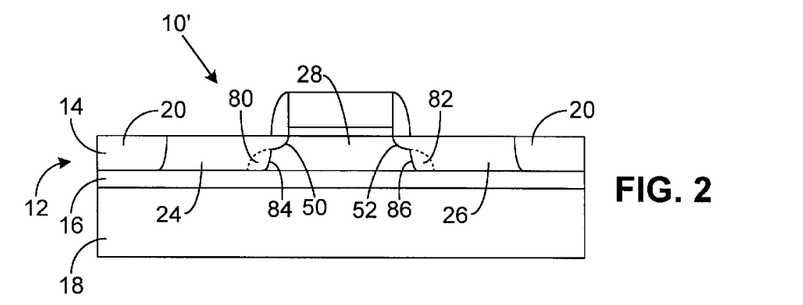
FIG. 2 is a cross-section of an SOI device according to a second embodiment of the present invention.

Referring now to FIG. 2, a second embodiment of the device 10' is illustrated. As with the device 10 of the first embodiment, the device 10' of the second embodiment has silicon-germanium formed in a region 80 of the source 24 and a region 82 of the drain 26. The silicon-germanium regions 80 and 82 are respectively formed adjacent a lower portion 84 of the source/body junction 50 and a lower portion 86 of the drain/body junction 52. Therefore, the lower portions 84 and 86 form hetero junctions to reduce floating body effects in the same manner as for the device 10 of the first embodiment. That is, the lower energy barriers to holes in the lower portions 84 and 86 of the source/body junction 50 and the drain/body junction 52 respectively help remove body charge from the body 28 so that floating body effects are reduced.

The silicon-germanium regions 80 and 82 are formed using tilted angled germanium implantation. More specifically, to form the region 80, germanium is implanted at an angle of 30 to 40 degrees from vertical tilted towards the source 24. To form the region 82, germanium is implanted at an angle of 30 to 40 degrees from vertical tilted toward the drain 26. The germanium is implanted with an energy of about 20 kev to about 80 kev and a dosage of about $1 \times 10^{14}$ atoms/cm$^2$ to about $1 \times 10^{16}$ atoms/cm$^2$. In each of the regions 80 and 82, the active layer 14 becomes silicon-germanium (SiGe). In one embodiment, the atomic concentration of silicon in the regions 80 and 82 is about 30% to about 70% and the atomic concentrations of germanium is about 70% to about 30%. The device 10' is a symmetrical transistor where both the source 24 and the drain 26 are provided with silicon-germanium regions 80 and 82. Depending on the device 10' being fabricated, however, additional angled implantations of germanium may be desired to form, for example, a halo of silicon-germanium around a body 28.

Figure 3:
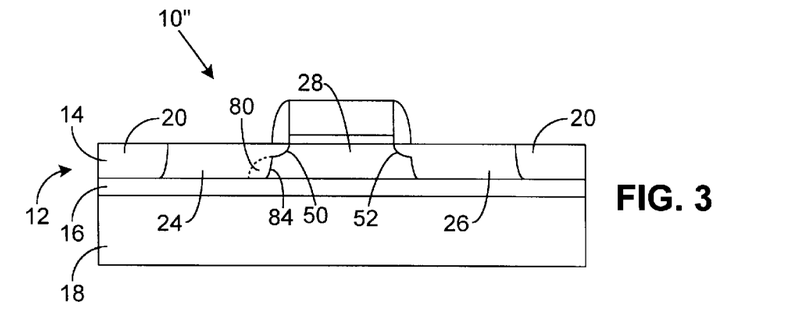
FIG. 3 is a cross-section of an SOI device according to a third embodiment of the present invention.

Referring now to FIG. 3, a device 10" according to a third embodiment of the present invention is illustrated. The device 10" is an asymmetric transistor and, similar to the device 10', has a region 80 of silicon-germanium disposed adjacent a lower portion 84 of the source/body junction 50. However, the device 10" does not have a silicon-germanium region on the drain 26 side of the device. The silicongermanium region 80 serves to reduce floating body effects as described above and is deposited using angled germanium implantation where the germanium is implanted at an angle 30 to 40 degrees from vertical tilted towards the source 24. The germanium is implanted with an energy of about 20 kev to about 80 kev and a dosage of about $1 \times 10^{14}$ atoms/cm$^2$ to about $1 \times 10^{16}$ atoms/cm$^2$. In the region 80, the active layer 14 becomes silicon-germanium (SiGe). In one embodiment, the atomic concentration of silicon in the region 80 is about 30% to about 70% and the atomic concentrations of germanium is about 70% to about 30%.

Figure 4:
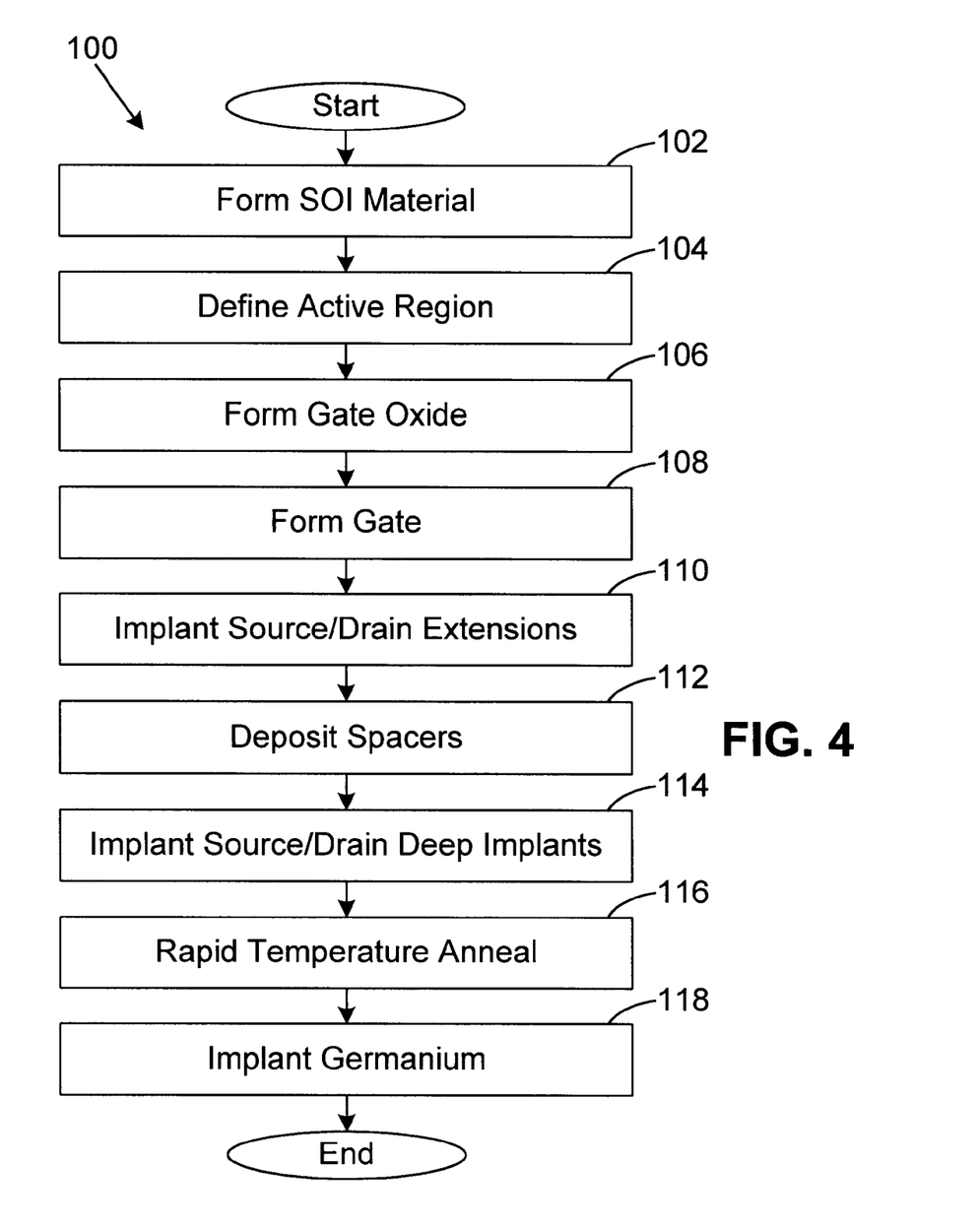
FIG. 4 is a flow chart illustrating a method of fabricating the SOI device of FIG. 1.

Referring now to FIG. 4, a method 100 of fabricating the device 10 illustrated in FIG. 1 is shown in flowchart format. With additional reference to FIG. 5a, the method 100 begins in step 102 where a wafer 12 of SOI material is formed. As mentioned, the wafer 12 has a silicon substrate 18 with a buried oxide (BOX) layer 16 disposed thereon. Disposed on the BOX layer 16 is a silicon active layer 14. The active layer 14 may be initially doped for the fabrication of an N-channel device or, as illustrated, a P-channel device.

Figures 5A, 5B:
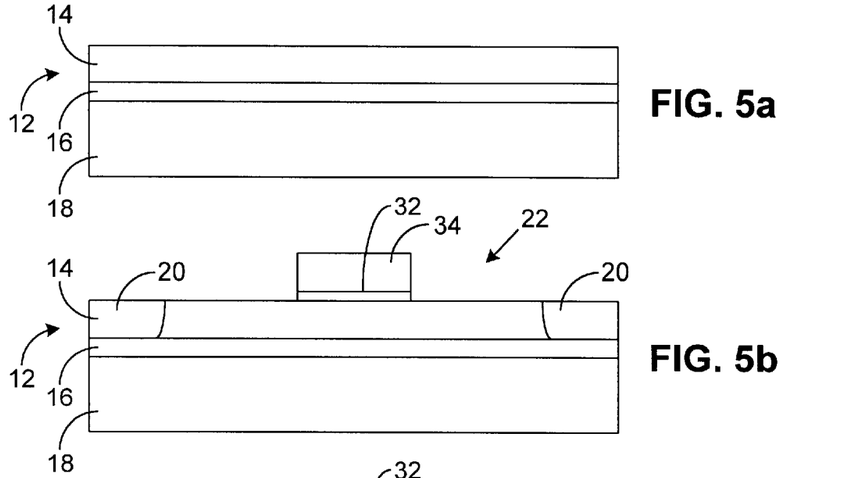
FIGS. 5a–5e are cross-sections of the SOI device of FIG. 1 in intermediate stages of fabrication.

Next, in step 104 and as illustrated in FIG. 5b, the active region 22 is defined. More specifically, STI regions 20 are formed to define the size and placement of the active region 22. Next, in step 106, the gate oxide layer 32 is formed using conventional techniques. Next, in step 108, the polysilicon gate portion 34, along with any other desired gate layers to form the gate stack, are formed on the gate oxide 32 using conventional techniques.

Figure 5C:
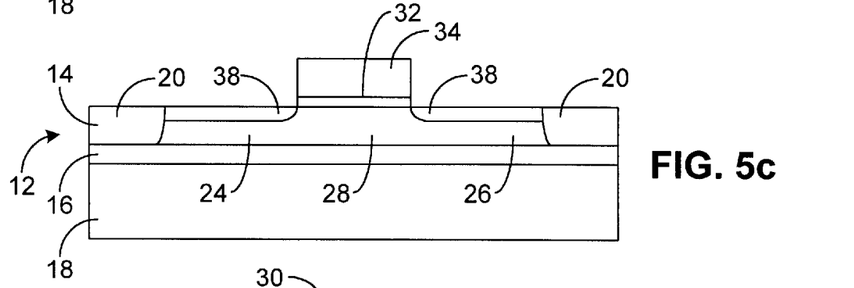

Next, in step 110, and as illustrated in FIG. 5c, source 24 and drain 26 extensions 38 are implanted. For an N-channel device, the extensions 38 are formed by implanting arsenic (As+) at, for example, an energy of about 1.0 kev to about 3.0 kev. For a P-channel device, the extensions 38 are formed by implanting boron (B+) at, for example, an energy of about 0.3 kev to about 1.5 kev. Regardless of the channel type, the implantation dose for the extensions 38 is, for example, about $1 \times 10^{14}$ atoms/cm$^2$ to about $1 \times 10^{15}$ atoms/cm$^2$.

Figure 5D:
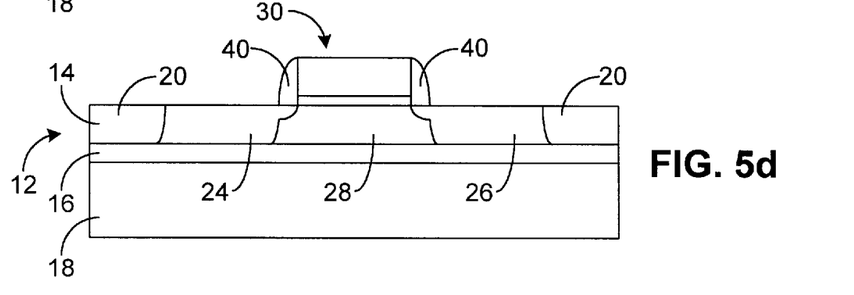

Next, in step 112 and as illustrated in FIG. 5d, side wall spacers 40 are formed adjacent the gate 30. The spacers 40 are formed using conventional techniques and are made from a material such as silicon oxide ($SiO_2$) or a nitride (e.g., $Si_3Na$).

With continued reference to FIG. 4 and FIG. 5d, the source 24 and drain 26 are further defined by source/drain deep implantation in step 114. For an N-channel device, the deep implantation is made by implanting arsenic at, for example, an energy of about 5 kev to about 30 kev and a dose of about $1 \times 10^{15}$ atoms/cm$^2$ to about $5 \times 10^{15}$ atoms/cm$^2$. For a P-channel device, the deep implantation is made by implanting boron at, for example, an energy of about 3 kev to about 15 kev and a dose of about $1 \times 10^{15}$ atoms/cm$^2$ to about $5 \times 10^{15}$ atoms/cm$^2$. As one skilled in the art will appreciate, the source/drain extensions 38 and source/drain deep implantation can be carried out using alternative dopants and/or at other appropriate energy levels and dose levels, as is desirable for the device being fabricated. Following deep implantation in step 114, the wafer 12, in step 116, is subjected to a thermal anneal cycle of at about 1,000° C. to about 1,150° C. for a period of about five seconds to about fifteen seconds or, alternatively, a rapid temperature anneal (RTA) cycle for about 0.1 seconds to about five seconds.

Figure 5E:
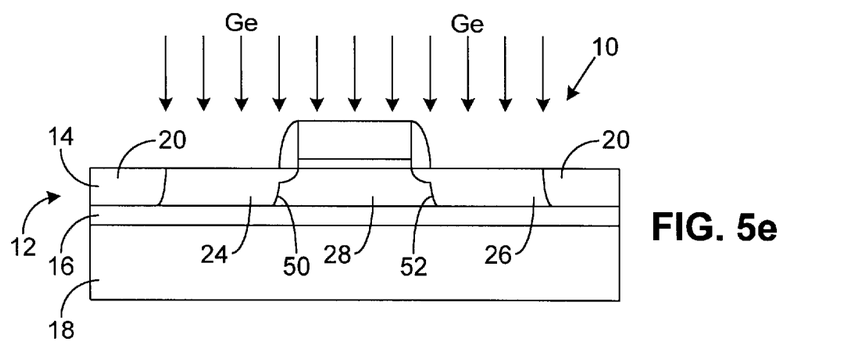

Next, in step 118 and as illustrated in FIGS. 1, 1*a* and 5*e*, the device 10 is subjected to germanium implantation. The germanium is implanted with an energy of about 20 kev to about 80 kev and a dose of about $1\times10^{14}$ atoms/cm$^2$ to about $1\times10^{16}$ atoms/cm$^2$. The germanium is implanted at substantially a zero angle (i.e., implanted generally perpendicular to the wafer 14). Most of the germanium traverses an upper portion 42 of the source 24 and an upper portion 44 of the drain 26 such that the germanium amorphizes the silicon and forms silicon-germanium (SiGe) in a lower portion 46 of the source 24 and a lower portion 48 of the drain 26.

Following germanium implantation, the wafer 12 may be annealed to recrystallize the source 24 and drain 26. Example annealing cycles can be either a furnace anneal of about 500° C. to about 600° C. for about one minute to about ten minutes or an RTA for about 0.1 seconds to about five seconds. It is also noted that the deep implantation step (step 114) and the germanium implantation step (step 118), along with their associated thermal cycles, could be reversed.

Figure 6:
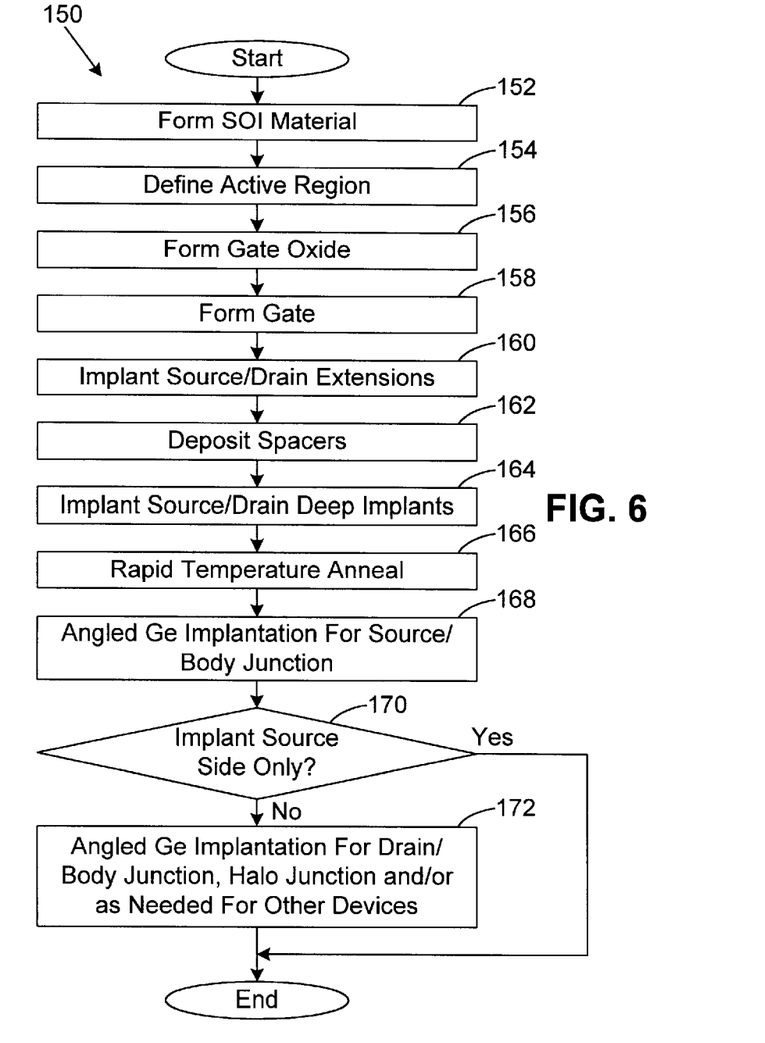
FIG. 6 is a flow chart illustrating a method of fabricating the SOI devices of FIGS. 2 and 3.
Figure 7A:
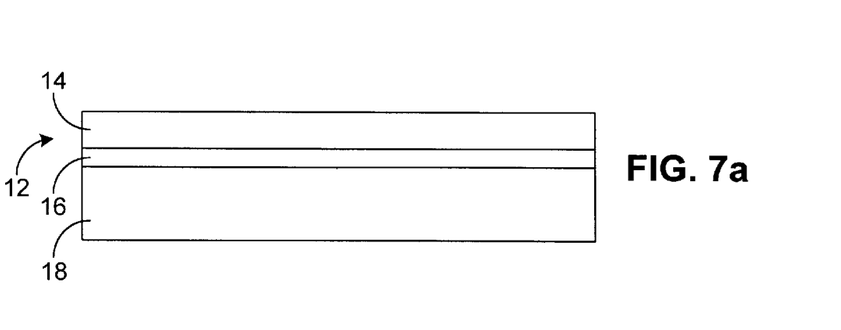
FIGS. 7a–7f are cross-sections of the SOI devices of FIGS. 2 and 3 in intermediate stages of fabrication.

Referring now to FIG. 6, a method 150 of fabricating the device 10' and the device 10" illustrated in FIGS. 2 and 3 respectively is shown in flowchart format. With additional reference to FIG. 7*a*, the method 150 begins in step 152 where a wafer 12 of SOI material is formed. As mentioned, the wafer 12 has a silicon substrate 18 with a buried oxide (BOX) layer 16 disposed thereon. Disposed on the BOX layer 16 is a silicon active layer 14. The active layer 14 may be initially doped for the fabrication of an N-channel device or, as illustrated, a P-channel device.

Figure 7B:
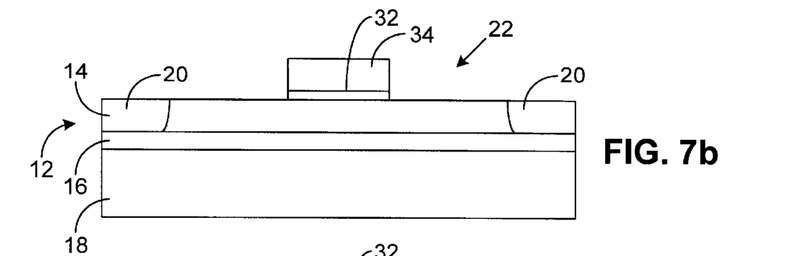

Next, in step 154 and as illustrated in FIG. 7*b*, the active region 22 is defined. More specifically, STI regions 20 are formed to define the size and placement of the active region 22. Next, in step 156, the gate oxide layer 32 is formed using conventional techniques. Next, in step 158, the polysilicon gate portion 34, along with any other desired gate layers to form the gate stack, are formed on the gate oxide 32 using conventional techniques.

Figure 7C:
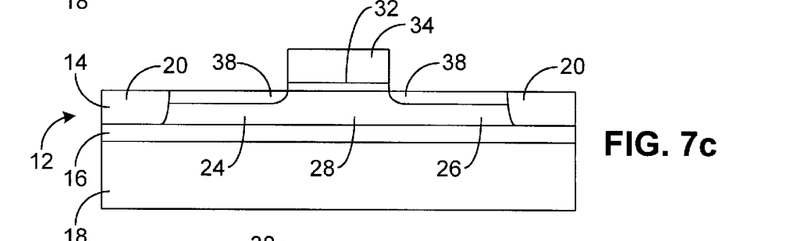

Next, in step 160, and as illustrated in FIG. 7*c*, source 24 and drain 26 extensions 38 are implanted. For an N-channel device, the extensions 38 are formed by implanting arsenic (As+) at, for example, an energy of about 1.0 kev to about 3.0 kev. For a P-channel device, the extensions 62 are formed by implanting boron (B+) at, for example, an energy of about 0.3 kev to about 1.5 kev. Regardless of the channel type, the implantation dose for the extensions 62 is, for example, about $1\times10^{14}$ atoms/cm$^2$ to about $1\times10^{15}$ atoms/cm$^2$.

Figure 7D:
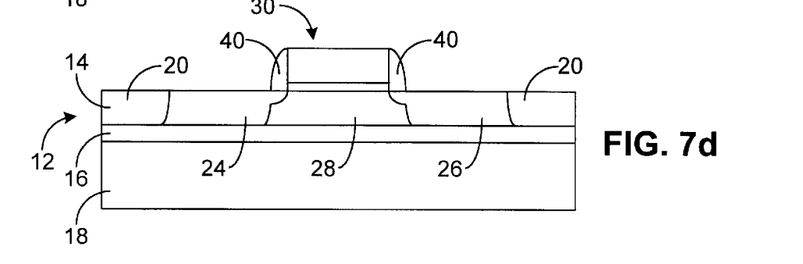

Next, in step 162 and as illustrated in FIG. 7*d*, side wall spacers 40 are formed adjacent the gate 30. The spacers are formed using conventional techniques and are made from a material such as silicon oxide (SiO$_2$) or a nitride (e.g., Si$_3$Na).

With continued reference to FIG. 6 and FIG. 7*d*, the source 24 and drain 26 are further defined by source/drain deep implantation in step 164. For an N-channel device, the deep implantation is made by implanting arsenic at, for example, an energy of about 5 kev to about 30 kev and a dose of about $1\times10^{15}$ atoms/cm$^2$ to about $5\times10^{15}$ atoms/cm$^2$. For a P-channel device, the deep implantation is made by implanting boron at, for example, an energy of about 3 kev to about 15 kev and a dose of about $1\times10^{15}$ atoms/cm$^2$ to about $5\times10^{15}$ atoms/cm$^2$. As one skilled in the art will appreciate, the source/drain extensions 38 and source/drain deep implantation can be carried out using alternative dopants and/or at other appropriate energy levels and dose levels, as is desirable for the device being fabricated. Following deep implantation in step 164, in step 166, the wafer 12 is subjected to a thermal anneal cycle of at about 1,000° C. to about 1,150° C. for a period of about five seconds to about fifteen seconds or, alternatively, a rapid temperature anneal (RTA) cycle for about 0.1 seconds to about five seconds.

Figure 7E:
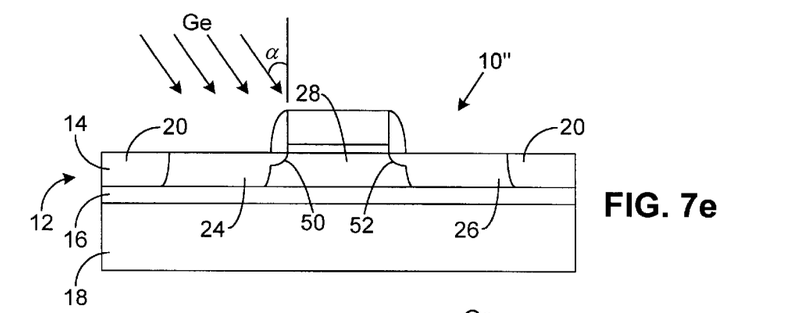

Next, in step 168 and as illustrated in FIGS. 2, 3 and 7*e*, the device 10' or 10" is subjected to tilted angle germanium implantation. The germanium is implanted with an energy of about 20 kev to about 80 kev and a dose of about $1\times10^{14}$ atoms/cm$^2$ about $1\times10^{16}$ atoms/cm$^2$. The germanium is implanted at an angle $\alpha$ of about 30 degrees to about 40 degrees from vertical and tilted towards the source 24. The tilted angle germanium implantation introduces germanium into the source 24 such that the silicon-germanium region 80 is formed adjacent the source/body junction 50 to establish a hetero junction along the lower portion 84 of the source/body junction 50 as described in more detail above.

If an asymmetrical device, or device 10", is desired having a partial hetero junction on the only the source 24 side and not the drain 26 side, then in step 170, the method 150 will end resulting in the device 10" illustrated in FIG. 3. Following germanium implantation, however, the wafer 12 may be annealed to re-crystallize the source 24 and drain 26. Example annealing cycles include a furnace anneal of about 500° C. to about 600° C. for about one minute to about ten minutes and an RTA for about 0.1 seconds to about five seconds. It is also noted that the deep implantation step (step 164) and the germanium implantation step (step 168), along with their associated thermal cycles, could be reversed.

Figure 7F:
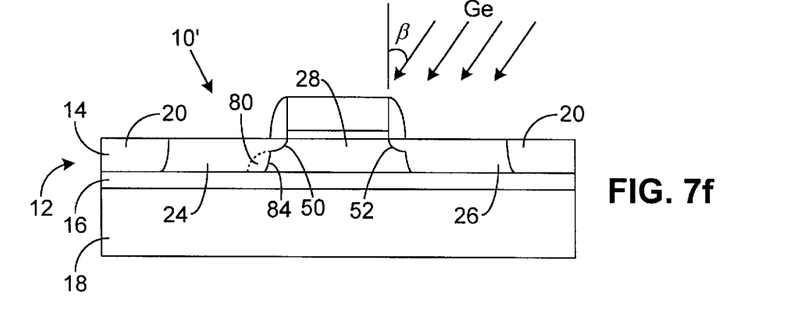

If in step 170, a symmetrical device, or device 10', is desired having a second partial hetero junction on the drain 26 side, the device 10' is subjected to a second tilted angle germanium implantation step in step 172 and as illustrated in FIGS. 2 and 7*f*. More specifically, germanium is implanted with an energy of about 20 kev to about 80 kev and a dose of about $1\times10^{14}$ atoms/cm$^2$ about $1\times10^{6}$ atoms/cm$^2$. The germanium is implanted at an angle $\beta$ of about 30 degrees to about 40 degrees from vertical and tilted towards the drain 26. The tilted angle germanium implantation introduces germanium into the drain 24 such that the silicon-germanium region 82 is formed adjacent the drain/body junction 52 to establish a hetero junction along the lower portion 86 of the drain/body junction 52 as described in more detail above.

In addition to the germanium implantation to form the silicon-germanium region 82, optional tilted angle implants from other directions may be used to form a partial halo hetero junction around the body 28 or to form similar hetero junctions in other devices on the wafer which have a different orientation than the device 10'. Following germanium implantation, the wafer 12 may be annealed to re-crystallize the source 24 and drain 26. Example annealing cycles include a furnace anneal of about 500° C. to about 600° C. for about one minute to about ten minutes and an RTA for about 0.1 seconds to about five seconds. It is also noted that the deep implantation step (step 164) and the germanium implantation steps (steps 168 and 172), along with their associated thermal cycles, could be reversed.

Although particular embodiments of the invention have been described in detail, it is understood that the invention is not limited correspondingly in scope, but includes all changes, modifications and equivalents coming within the spirit and terms of the claims appended hereto.

For example, in making the device 10 illustrated in FIG. 1, a mask may be used to prevent or minimize germanium implantation into the drain 16 to produce an asymmetric transistor.

What is claimed is:

1. A silicon-on-insulator (SOI) transistor formed from a wafer having a layer of silicon disposed on an insulating layer, the insulating layer disposed on a semiconductor substrate, comprising a source and a drain having a body disposed therebetween, the source, the drain and the body being formed from the layer of silicon and each of the source and the drain having an extension region and a deep doped region, the extension regions having a junction depth, a gate electrode is disposed over the body region and defines a channel extending from the extension of the source to the extension of the drain, the source being implanted with germanium to form an area of silicon-germanium adjacent a junction of the deep doped region of the source and the body and extending from the source extension junction depth to the insulating layer, the area of silicon-germanium in the source forming a hetero junction along the junction of the deep doped region of the source and the body.

2. The SOI transistor according to claim 1, wherein the germanium is implanted at substantially a zero angle and at an energy so that the germanium traverses an upper portion of the source.

3. The SOI transistor according to claim 2, wherein the source extension region is relatively germanium free.

4. The SOI transistor according to claim 1, wherein the germanium is implanted at an angle of about 30 to about 40 degrees from vertical titled toward the source.

5. The SOI transistor according to claim 1, wherein the drain is implanted with germanium to form an area of silicon-germanium adjacent a junction of the deep doped region of the drain and the body and extending from the drain extension junction depth to the insulating layer, the area of silicon-germanium in the drain forming a hetero junction along the junction of the deep doped region of the source and the body.

6. The SOI transistor according to claim 5, wherein the germanium is implanted into the source and drain at substantially a zero angle and at an energy so that the germanium respectively traverses an upper portion of the source and an upper portion of the drain.

7. The SOI transistor according to claim 5, wherein the germanium implanted into the source is implanted at an angle of about 30 to about 40 degrees from vertical tilted toward the source and the germanium implanted into the drain is implanted at an angle of about 30 to about 40 degrees from vertical tilted toward the drain.

8. The SOI transistor according to claim 5, wherein the source extension region and the drain extension region are relatively germanium free.

9. The SOI transistor according to claim 1, wherein a portion of the deep doped region of the source laterally distal the junction of the deep doped region of the source and the body is substantially free of germanium.

* * * * *

UNITED STATES PATENT AND TRADEMARK OFFICE
CERTIFICATE OF CORRECTION

PATENT NO.   : 6,445,016 B1
DATED        : September 3, 2002
INVENTOR(S)  : An et al.

It is certified that error appears in the above-identified patent and that said Letters Patent is hereby corrected as shown below:

<u>Column 2,</u>
Line 59, replace "silicone germanium" with -- silicon-germanium --

<u>Column 6,</u>
Line 36, replace "1 x 10^6" with -- 1 x 10^16 --

Signed and Sealed this

Thirty-first Day of December, 2002

JAMES E. ROGAN
*Director of the United States Patent and Trademark Office*